US012779533B2

(12) United States Patent
Im et al.

(10) Patent No.: US 12,779,533 B2
(45) Date of Patent: Nov. 3, 2026

(54) SN—TI ALLOY POWDER FOR SUPERCONDUCTING WIRE, METHOD FOR PREPARING SAME, AND METHOD FOR MANUFACTURING SUPERCONDUCTING WIRE USING THE SAME

(71) Applicant: K. A. T. CO., LTD, Daejeon (KR)

(72) Inventors: Jaeduk Im, Daejeon (KR); Jiman Kim, Daejeon (KR); Heonhwan Kim, Daejeon (KR); Iksang Shin, Sejong (KR); Sinhye Na, Daejeon (KR)

(73) Assignee: K. A. T. Co., LTD., Daejeon (KR)

( * ) Notice: Subject to any disclaimer, the term of this patent is extended or adjusted under 35 U.S.C. 154(b) by 1274 days.

(21) Appl. No.: 17/641,963

(22) PCT Filed: Sep. 22, 2020

(86) PCT No.: PCT/KR2020/012805
§ 371 (c)(1),
(2) Date: Mar. 10, 2022

(87) PCT Pub. No.: WO2021/066376
PCT Pub. Date: Apr. 8, 2021

(65) Prior Publication Data

US 2022/0320415 A1 Oct. 6, 2022

(30) Foreign Application Priority Data

Oct. 3, 2019 (KR) ........................ 10-2019-0122726
Sep. 16, 2020 (KR) ........................ 10-2020-0118690

(51) Int. Cl.
*B22F 9/08* (2006.01)
*B22F 1/00* (2022.01)
*H10N 60/01* (2023.01)

(52) U.S. Cl.
CPC .................. *B22F 9/08* (2013.01); *B22F 1/00* (2013.01); *H10N 60/0128* (2023.02); *H10N 60/0156* (2023.02); *H10N 60/0184* (2023.02)

(58) Field of Classification Search
CPC ........................................................ B22F 9/08
See application file for complete search history.

(56) References Cited

U.S. PATENT DOCUMENTS 4,762,553 A * 8/1988 Savage ..................... B22F 9/08 425/10
5,609,919 A * 3/1997 Yuan ......................... C23C 6/00 427/427
2004/0079194 A1* 4/2004 Nakata ...................... B22F 1/16 75/332

FOREIGN PATENT DOCUMENTS

JP 2010-255115 A 11/2010
KR 10-2006-0025503 A 3/2006

(Continued)

*Primary Examiner* — Paul A Wartalowicz
(74) *Attorney, Agent, or Firm* — NKL Law; Jae Youn Kim

(57) ABSTRACT

Provided are a Sn—Ti alloy powder for a superconducting wire, the Sn—Ti alloy powder making it possible to improve superconducting characteristics by minimizing the size of Sn—Ti particles dispersed in a Sn-based alloy, a method for preparing the same, and a method for manufacturing a superconducting wire using the same, wherein a Sn—Ti alloy is melted to produce a Sn—Ti intermetallic compound having an average particle size of 3 μm or less, and a content of Ti in the entire alloy is 0.5 wt % to 3 wt %, and the method of preparing the Sn—Ti alloy powder for a superconducting wire includes: a Sn—Ti alloy melting step of melting a Sn—Ti alloy or a Sn—Ti alloy processed material; and a Sn—Ti alloy powder formation step of spraying and solidifying a molten Sn—Ti alloy through a nozzle in an inert gas atmosphere.

1 Claim, 2 Drawing Sheets

(56) References Cited

FOREIGN PATENT DOCUMENTS

| | | | |
|---|---|---|---|
| KR | 10-2009-0077364 | A | 7/2009 |
| KR | 10-2010-0107927 | A | 10/2010 |
| KR | 10-2016-0124068 | A | 10/2016 |

* cited by examiner

SN—TI ALLOY POWDER FOR SUPERCONDUCTING WIRE, METHOD FOR PREPARING SAME, AND METHOD FOR MANUFACTURING SUPERCONDUCTING WIRE USING THE SAME

TECHNICAL FIELD

The present disclosure relates to a Sn—Ti alloy powder for a superconducting wire, a method for preparing the same, and a method for manufacturing a superconducting wire using the same, and more particularly, to a Sn—Ti alloy powder for a superconducting wire, the Sn—Ti alloy powder making it possible to improve superconducting properties and mechanical properties by minimizing the size of Sn—Ti particles dispersed in a Sn-based alloy, a method for preparing the same, and a method for manufacturing a superconducting wire using the same.

BACKGROUND ART

Superconductivity is a phenomenon in which the resistance to current vanishes and so does heat loss due to the resistance generated by the collision of electrons inside a material; the resistance of many metals suddenly becomes ‘0’ at a low temperature around from −265° C. to −196° C., which are a liquid helium temperature and a liquid nitrogen temperature range, and the material at this resistance is called a superconductor, and the temperature at which superconductivity occurs is called ‘critical temperature’.

The most important characteristics of a superconductor in which the superconducting phenomenon as described above occurs are that the super conductor is a non-resistive material without electric resistance which prevents the flow of current, and is a diamagnetic material that does not pass through a magnetic field.

In general, all materials consist of molecular magnets that are attracted to a magnet as a whole, while being arranged in the direction of an external magnetic field; common materials in which the effect of molecular magnets being arranged in a direction to a magnetic field is very weak and thus the phenomenon that the materials are attracted to a magnet is hardly observed in daily life are called paramagnetic materials, and materials that are easily attracted to magnets because of their strong properties as described above, that is, materials such as iron, are called ferromagnetic materials.

However, as diamagnetic materials do not have the above-described molecular magnets, electrons thereinside generate an induced current by electromagnetic induction with respect to an external magnetic field, and this induced current blocks the external magnetic field, and accordingly, the diamagnetic materials receive a force in a direction in which they are pushed by a magnet.

That is, a superconductor not only has an electric resistance of ‘0’, but also has very strong diamagnetic properties as described above, and accordingly, a magnetic field inside an object thereof becomes ‘0’ by completely blocking the external magnetic field. When a superconductor is used as a coil, since there is no heat loss due to resistance, it is possible to make an electromagnet that can form a very strong magnetic field even with a small current, and if a magnet is placed on a superconductor, which is a diamagnetic material, the magnetic field of the magnet cannot pass through the superconductor and is rejected, thereby generating the effect of levitating the magnet.

A superconducting material having no electrical resistance and diamagnetic properties at the same time as described above may be divided into a high-temperature superconductor and a low-temperature superconductor, wherein in the former, the superconducting phenomenon occurs near at a liquid nitrogen temperature (77K), and in the latter near at a liquid helium temperature (4K). More than 1,000 kinds of superconducting materials as described above have been found in metals, organic materials, ceramics, and compounds, and about five to six kinds, such as a Nb—Ti alloy which is a metal-based superconducting material and $Nb_3Sn$, $Nb_3Al$, etc, which are compound-based superconducting materials are currently put into practical use.

In addition, a superconducting magnet that generates a strong magnetic field by winding a superconducting wire as above in the form of a coil and passing a large current therethrough is currently in use, and devices that are expected to be actively applied in the future include a magnetic levitation train, a nuclear fusion reactor, a particle accelerator, medical magnetic imaging systems (MRI), nuclear magnetic resonance (NMR) devices used as various physical property analysis equipment, protein material analysis system (FT-ICR), particle accelerator, magnetic levitation train and tokamak equipment for nuclear fusion reactors, etc. A representative superconducting wire of a superconducting magnet used in this field is a $Nb_3Sn$-based superconducting wire.

The $Nb_3Sn$-based superconducting wire has a structure in which a large number of ultra-fine $Nb_3Sn$ filaments are arranged in a copper base, and methods of manufacturing the $Nb_3Sn$-based superconducting wire include an internal diffusion method, a bronze method, a jelly roll method, a powder method, an external diffusion method, or the like are known.

The $Nb_3Sn$-based superconducting wire has been mainly manufactured by the internal diffusion method in which heat treatment is performed on a precursor, which is obtained by drilling a hole in a center portion of an extruded material obtained by placing and inserting a Nb filament in an appropriate position inside a copper-based metal, and Sn or a Sn-based alloy is inserted into the hole and a drawing process is repeatedly performed thereon, to thereby cause a mutual diffusion reaction between the Nb filament inserted into the precursor and the Sn or Sn-based alloy forms a $Nb_3Sn$ compound, which is a superconductor material, around the Nb filament and on the peripheral surface thereof.

As described above, numerous holes are drilled in a copper base metal and Nb filaments are inserted into the holes, and various extrusion processes are performed on the above copper base metal to form a bar material having a certain diameter, and a hole is drilled in a center of the bar material, and Sn or a Sn-based alloy is inserted into the hole as a core, such that a plurality of Nb filaments are inserted and arranged around Sn or the Sn-based alloy in a center of the copper base metal, and such an arrangement is called a ‘sub-element’.

That is, the $Nb_3Sn$ superconducting wire may be formed by preparing a piece of precursor by repeatedly drawing one sub-element formed by combining Cu, Nb filaments, and a Sn wire and then heat-treating the precursor; also, by densely inserting a plurality of precursors formed by drawing the sub-element in a copper tube and repeatedly drawing the same and performing heat treatment thereon, like an electric wire in which a plurality of copper wires are densely inserted, one superconducting wire may be formed, in which a plurality of ultra-fine superconducting wires are densely arranged in one copper tube.

Here, the sub-element is drawn into precursors having various cross-sectional shapes so that a plurality thereof may be inserted into a copper tube, and Sn or a Sn-based alloy may be inserted between the precursors as a spacer to eliminate a gap between the plurality of precursors inserted into the copper tube.

A Sn-based alloy used for a sub-element for manufacturing a $Nb_3Sn$ superconducting wire by the internal diffusion method as described above is disclosed in U.S. Pat. No. 6,548,187, and the Sn-based alloy contains Ti in an amount of 5 wt % or less, and is prepared by casting a molten Sn heated to a temperature of 1300° C. to 1500° C., wherein the Sn-based alloy is prepared by adjusting a particle size of a Sn—Ti compound, that is, a length thereof to an average of 5 μm to 20 μm and a maximum of 30 μm or less, and there is a report that the critical current density of a $Nb_3Sn$ superconducting wire manufactured by the above Sn-based alloy is improved from 650 A/mm$^2$ to 750 A/mm$^2$ at 12 T.

However, when the Sn-based alloy in the above form, in which SnTi particles are dispersed, is used in a sub-element for a $Nb_3Sn$ superconducting wire and heat treated, diffusion between the SnTi particles and the Nb filament surrounding the Sn-based alloy may not be sufficient, and this may degrade the superconducting properties.

DESCRIPTION OF EMBODIMENTS

Technical Problem

The present disclosure provides a Sn—Ti alloy powder for a superconducting wire, the Sn—Ti alloy powder making it possible to improve superconducting properties and mechanical properties by minimizing the size of Sn—Ti particles dispersed in a Sn-based alloy and adding Nb, Ta, Cu, Zr, Hf, V, Zn, In, or the like, to the alloy, a method of preparing the same, and a method for manufacturing a superconducting wire using the same.

The present disclosure also provides a Sn—Ti alloy powder for a superconducting wire, the Sn—Ti alloy powder making it possible to improve processibility and productivity, a method for preparing the same, and a method for manufacturing a superconducting wire using the same.

Solution to Problem

A Sn—Ti alloy powder for a superconducting wire according to the present disclosure is prepared, wherein a Sn—Ti alloy is melted to produce a Sn—Ti intermetallic compound having an average particle size of 3 μm or less, and a content of Ti in the entire alloy is 0.5 wt % to 3 wt %.

In addition, the present disclosure relates to a method for preparing the Sn—Ti alloy powder for a superconducting wire, the method including:

a Sn—Ti alloy melting step of melting a Sn—Ti alloy or a Sn—Ti alloy processed material; and a Sn—Ti alloy powder formation step of spraying and solidifying a molten Sn—Ti alloy through a nozzle in an inert gas atmosphere.

Also, the method includes: a Sn—Ti alloy melting step of adding one or more materials selected from Nb, Ta, Cu, Zr, Hf, V, Zn, and In, on the basis of Sn and Ti, and melting the same; and a Sn—Ti alloy powder formation step of spraying and solidifying a molten Sn—Ti alloy through a nozzle in an inert gas atmosphere.

In addition, in the entire alloy, one or more materials selected from Nb, Ta, Cu, Zr, Hf, V, Zn, and In may be 0.1 wt % to 2 wt %.

A method of manufacturing a superconducting wire by using the Sn—Ti alloy powder for a superconducting wire includes: a sub-element or spacer formation step of manufacturing a sub-element or spacer by performing press processing or powder extrusion on the Sn—Ti alloy powder or inserting the Sn—Ti alloy into a Cu tube and performing drawing thereon;

an sub-element assembly step of installing the manufactured sub-element in the Cu tube; and a superconducting wire manufacturing step of completing a superconducting wire by performing wire fabricating process such as drawing.

Also, the method includes: a sub-element or spacer formation step of manufacturing a sub-element or spacer by adding one or more materials selected from Nb, Ta, Cu, Zr, Hf, V, Zn, and In, in addition to the Sn—Ti alloy powder, performing press processing or powder extrusion on the above Sn—Ti alloy powder and the added materials or inserting on the above Sn—Ti alloy powder and the added materials into a Cu tube and performing drawing processing thereon;

an sub-element assembly step of installing the manufactured sub-element in the Cu tube; and a superconducting wire manufacturing step of completing a superconducting wire by performing wire fabricating process such as drawing.

In addition, in the entire alloy, one or more materials selected from Nb, Ta, Cu, Zr, Hf, V, Zn, and In may be 0.1 wt % to 2 wt %.

Advantageous Effects of Disclosure

Through the problem solving means as described above, superconducting properties and mechanical properties may be improved and the processibility and productivity may be increased by minimizing, to 3 μm or less, the size of Sn—Ti particles dispersed in a Sn-based alloy and adding Nb, Ta, Cu, Zr, Hf, V, Zn, In, or the like, to the alloy.

MODE OF DISCLOSURE

A preferred embodiment of a method of manufacturing a superconducting wire, according to the present disclosure, will be described in detail with reference to the attached drawings.

Figure 1:
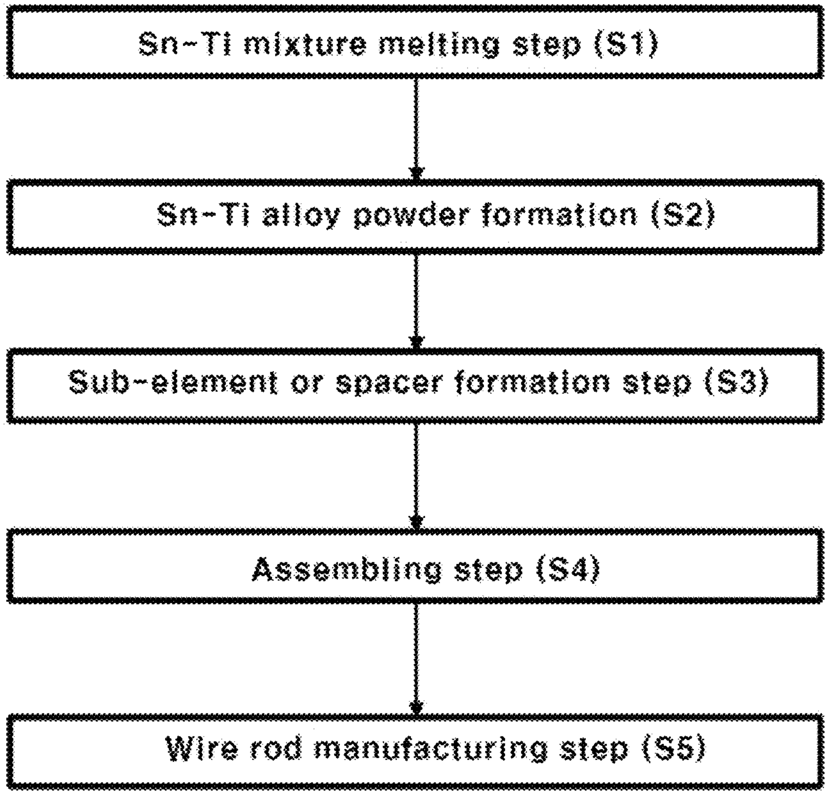
FIG. 1 is a block diagram illustrating a method of preparing a Sn—Ti alloy powder for a superconducting wire according to the present disclosure, and a method of manufacturing a superconducting wire by using the same.
Figure 2A:
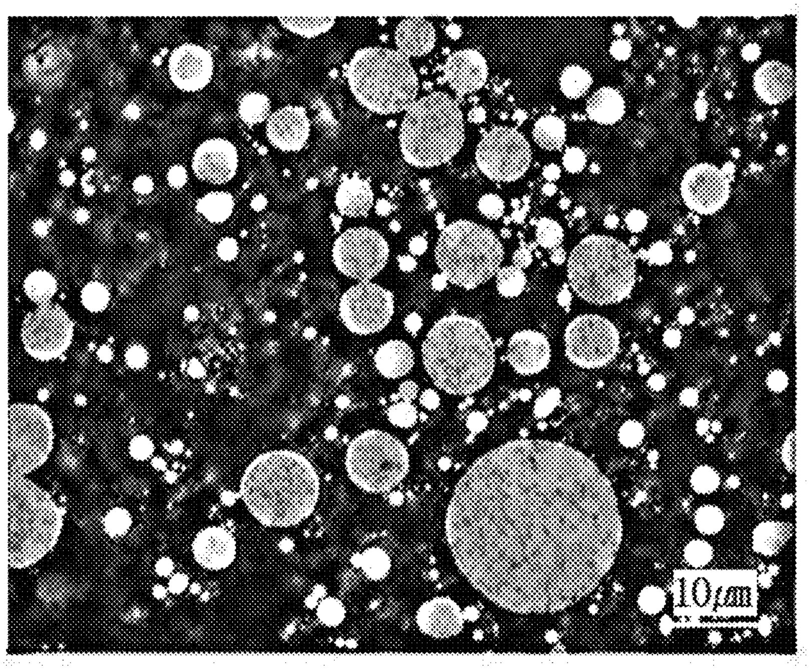
FIGS. 2A-2B are photographic images comparing tissues of a cross-section of a Sn—Ti intermetallic compound prepared according to the method of preparing a Sn—Ti alloy powder for a superconducting wire according to the present disclosure and a cross-section of an intermetallic compound in a Sn alloy according to the related art.
Figure 2B:

FIG. 1 is a block diagram illustrating a method of manufacturing a superconducting wire according to the present disclosure, and FIGS. 2A-2B are photographic images comparing tissues of a cross-section of a Sn—Ti intermetallic compound prepared according to a method of preparing a Sn—Ti alloy powder for a superconducting wire, according to the present disclosure, and a cross-section of an intermetallic compound in a Sn alloy according to the related art.

In general, $Nb_3Sn$ superconducting wires are manufactured by densely arranging, in an anti-diffusion tube, a plurality of modules, in which sub-elements and spacers are formed by forming a hole in a forged Cu billet through gun drilling, inserting a Nb rod into the hole, and then inserting Nb filaments in a Cu base around the Nb rod, and the sub-elements and spacers are cut and cleaned, and forming a restacking billet and performing steps such as drawing, wire drawing, heat treatment, or the like thereon. The superconducting wire according to the present disclosure is characterized in the process of formation of sub-elements and spacers during the above manufacturing process.

In the present disclosure, in manufacturing a sub-element or spacer, a Sn—Ti alloy is melted to produce a Sn—Ti intermetallic compound having an average particle size of 3 μm or less, and the melted Sn—Ti alloy is directly used in as the sub-element or spacer.

Here, a content of Ti in the entire Sn—Ti alloy is 0.5 wt % to 3 wt %.

A method of preparing the Sn—Ti alloy powder as above includes, as illustrated in FIG. 1, a Sn—Ti alloy melting step of melting a Sn—Ti alloy or a Sn—Ti alloy processed material, and a Sn—Ti alloy powder formation step of spraying and solidifying a molten Sn—Ti alloy through a nozzle in an inert gas atmosphere.

In detail, in the Sn—Ti alloy powder formation step, a method of inserting Sn and Ti into a furnace, performing vacuum pumping to lower the inside of a spray chamber to $2.5\times10^{-5}$ Torr or less, and then, forming an inert gas atmosphere to substitute the inside of the spray chamber with an inert gas such as Ar gas, to 1 bar, and spraying the inert gas at 100 bar by heating a Sn—Ti alloy in the furnace to 1100° C. to 1300° C. and melting the same, and opening an orifice of the furnace to spray a molten product of the Sn—Ti alloy, may be applied, but the step is not limited to the above-described conditions.

The method of manufacturing a superconducting wire by using the Sn—Ti alloy powder prepared as described above may include a sub-element or spacer formation step of manufacturing a sub-element or spacer by performing press processing or powder extrusion on the Sn—Ti alloy powder or inserting the Sn—Ti alloy powder into a Cu tube and performing drawing thereon, an sub-element assembly step of installing the manufactured sub-element in a Cu tube, and a superconducting wire manufacturing step of completing a superconducting wire by performing wire fabricating process such as drawing.

According to this, hardening of the interface due to residual stress on the surface due to forced grinding of Sn alloy castings according to the related art, through mechanical grinding, and deterioration of the superconducting properties caused by the hardening, and the difficulty in terms of processing such as the increase of heat treatment time in the manufacturing process may be addressed, and furthermore, excellent bonding between powders during processing may be achieved, and above all, the particle shape of the Sn—Ti intermetallic compound formed in a final superconducting wire may be optimized, and the size thereof may be minimized to a state, which is difficult to achieve according to the methods of the related art.

In addition, the processability and productivity may be increased by simplifying the complex powder manufacturing process consisting of rolling, drawing, crushing, grinding, and the like.

In fact, when comparing photograph (A) of the Sn—Ti intermetallic compound prepared according to the present disclosure with photograph (B) of the Sn—Ti intermetallic compound in the Sn alloy according to the related art, the particles of the Sn—Ti intermetallic compound particles formed according to the present disclosure are much closer to a spherical shape than the particles formed by the related art, and the particle size thereof is also significantly smaller.

Hereinafter, application examples of the method of preparing Sn—Ti alloy powder according to the present disclosure are described.

Application Example 1 of the method of preparing a Sn—Ti alloy powder, according to the present disclosure, includes a Sn—Ti alloy melting step of adding, on the basis of Sn and Ti, one or more materials selected from Nb, Ta, Cu, Zr, Hf, V, Zn, In, and melting the same, and a Sn—Ti alloy powder formation step of spraying and solidifying a molten Sn—Ti alloy through a nozzle in an inert gas atmosphere.

Here, in the entire alloy, one or more materials selected from Nb, Ta, Cu, Zr, Hf, V, Zn, and In are 0.1 wt % to 2 wt %.

In detail, in the Sn—Ti alloy powder formation step, a method of inserting, into a furnace, in addition to Sn and Ti, one or more materials selected from Nb, Ta, Cu, Zr, Hf, V, Zn, and In, at a 0.1 wt % to 2 wt % with respect to the entire alloy, performing vacuum pumping to lower the inside of a spray chamber to $2.5\times10^{-5}$ Torr or less, and then, forming an inert gas atmosphere to substitute the inside of the spray chamber with an inert gas such as Ar gas, to 1 bar, and spraying the inert gas at 100 bar by heating a Sn—Ti alloy in the furnace to 1100° C. to 1300° C. and melting the same, and opening an orifice of the furnace to spray a molten product of the Sn—Ti alloy, may be applied, but the step is not limited to the above-described conditions.

The method of manufacturing a superconducting wire by using the Sn—Ti alloy powder prepared using the Sn—Ti alloy powder preparing method according to Application Example 1 may include a sub-element or spacer formation step of manufacturing a sub-element or spacer by performing press processing or powder extrusion on the Sn—Ti alloy powder or inserting the Sn—Ti alloy powder into a Cu tube and performing drawing thereon, an sub-element assembly step of installing the manufactured sub-element in a Cu tube, and a superconducting wire manufacturing step of completing a superconducting wire by performing wire fabricating process such as drawing.

Application Example 2 of the method of preparing a Sn—Ti alloy powder, according to the present disclosure, includes a Sn—Ti alloy melting step of melting a Sn—Ti alloy and a Sn—Ti alloy powder formation step of spraying and solidifying a molten Sn—Ti alloy in an inert gas atmosphere through a nozzle.

In detail, in the Sn—Ti alloy powder formation step, a method of inserting Sn and Ti into a furnace, performing vacuum pumping to lower the inside of a spray chamber to $2.5\times10^{-5}$ Torr or less, and then, forming an inert gas atmosphere to substitute the inside of the spray chamber with an inert gas such as Ar gas, to 1 bar, and spraying the inert gas at 100 bar by heating a Sn—Ti alloy in the furnace to 1100° C. to 1300° C. and melting the same, and opening an orifice of the furnace to spray a molten product of the Sn—Ti alloy, may be applied, but the step is not limited to the above-described conditions.

The method of manufacturing a superconducting wire by using the Sn—Ti alloy powder prepared using the Sn—Ti alloy powder preparing method according to Application Example 2 may include a sub-element or spacer formation step of manufacturing a sub-element or spacer by adding one or more materials selected from Nb, Ta, Cu, Zr, Hf, V, Zn, and In, in addition to the Sn—Ti alloy powder, performing press processing or powder extrusion on the above Sn—Ti alloy powder and the added materials or inserting on the above Sn—Ti alloy powder and the added materials into a Cu tube and performing drawing processing thereon, an sub-element assembly step of installing the manufactured sub-element in a Cu tube, and a superconducting wire manufacturing step of completing a superconducting wire by performing wire fabricating process such as drawing.

Here, in the entire alloy, one or more materials selected from Nb, Ta, Cu, Zr, Hf, V, Zn, and In are 0.1 wt % to 2 wt %.

According to this, hardening of the interface due to residual stress on the surface due to forced grinding of Sn alloy castings according to the related art, through mechanical grinding, and deterioration of the superconducting properties caused by the hardening, and the difficulty in terms of processing such as the increase of heat treatment time in the manufacturing process may be addressed, and furthermore, excellent bonding between powders during processing may be achieved, and above all, the particle shape of the Sn—Ti intermetallic compound formed in a final superconducting wire may be optimized, and the size thereof may be minimized to a state, which is difficult to achieve according to the methods of the related art. In addition, by adding Nb, Ta, Cu, Zr, Hf, V, Zn, In, the mechanical properties may be improved to thereby improve the processibility during processing to a superconducting wire.

In addition, the processability and productivity may be increased by simplifying the complex powder manufacturing process consisting of rolling, drawing, crushing, grinding, and the like.

According to the configuration as described above, the superconducting properties and mechanical properties may be improved and processibility and productivity may be increased by minimizing the size of the Sn—Ti intermetallic compound particles dispersed in a Sn-based alloy of the present disclosure, to an average particle size of 3 μm or less, and adding Nb, Ta, Cu, Zr, Hf, V, Zn, In, or the like to the alloy.

INDUSTRIAL APPLICABILITY

The Sn—Ti alloy powder for a superconducting wire, the method of preparing the same, and the method of manufacturing a superconducting wire by using the same, according to the present disclosure, are applicable the manufacture of superconducting wire and various industrial fields where superconducting wires are used.

The invention claimed is:

1. A method of preparing a Sn—Ti alloy powder for a superconducting wire, wherein a Sn—Ti alloy is melted to produce a Sn—Ti intermetallic compound having an average particle size of 3 μm or less, and a content of Ti in the entire alloy is 0.5 wt % to 3 wt %, the method comprising:

a Sn—Ti alloy melting step of melting the Sn—Ti alloy or a Sn—Ti alloy processed material; and a Sn—Ti alloy powder formation step of spraying and solidifying the molten Sn—Ti alloy through a nozzle in an inert gas atmosphere.

* * * * *